United States Patent [19]

Ballmer et al.

[11] Patent Number: 4,876,535
[45] Date of Patent: Oct. 24, 1989

[54] METHOD AND APPARATUS FOR NON-CONTACTING INFORMATION TRANSMISSION

[75] Inventors: Horst Ballmer, Heidenheim; Rudolf Grosskopf, Konigsbronn, both of Fed. Rep. of Germany

[73] Assignee: Zeiss Ikon AG, Fed. Rep. of Germany

[21] Appl. No.: 93,717

[22] Filed: Sep. 8, 1987

[30] Foreign Application Priority Data

Sep. 6, 1986 [DE] Fed. Rep. of Germany ....... 3630456

[51] Int. Cl.$^4$ .......................... G06K 7/08; G06K 9/00
[52] U.S. Cl. .............................. 340/825.340; 235/380; 235/451; 340/825.310
[58] Field of Search ...................... 340/825.34, 825.31, 340/825.3, 825.33, 825.34, 825.54, 825.37, 505, 562, 563, 541, 543; 235/451, 380, 382, 382.5

[56] References Cited

U.S. PATENT DOCUMENTS

| | | | |
|---|---|---|---|
| 3,189,731 | 6/1965 | Bowman | 235/451 |
| 3,641,316 | 2/1972 | Dethloff et al. | 340/825.34 |
| 3,689,885 | 9/1972 | Kaplan et al. | 340/825.34 |
| 3,699,311 | 10/1972 | Dunbar | 235/451 |
| 4,650,981 | 3/1987 | Foletta | 340/825.33 |
| 4,706,084 | 11/1987 | Meyers et al. | 340/825.34 |

OTHER PUBLICATIONS

J. H. Meier, "Capacitive Document Sensing", Apr. 1969, IBM Technical Disclosure Bulletin, pp. 1593, 1594.

Primary Examiner—Donald J. Yusko
Assistant Examiner—E. O. Pudpud
Attorney, Agent, or Firm—Hill, Van Santen, Steadman & Simpson

[57] ABSTRACT

An apparatus for non-contacting information transmission between a data carrier and a data reader includes providing at least two electrodes on the surface of the data carrier which are brought together which at least two electrodes in the data reader to form capacitors to produce at least one common circuit of the data carrier and data reader for information transmission.

7 Claims, 5 Drawing Sheets

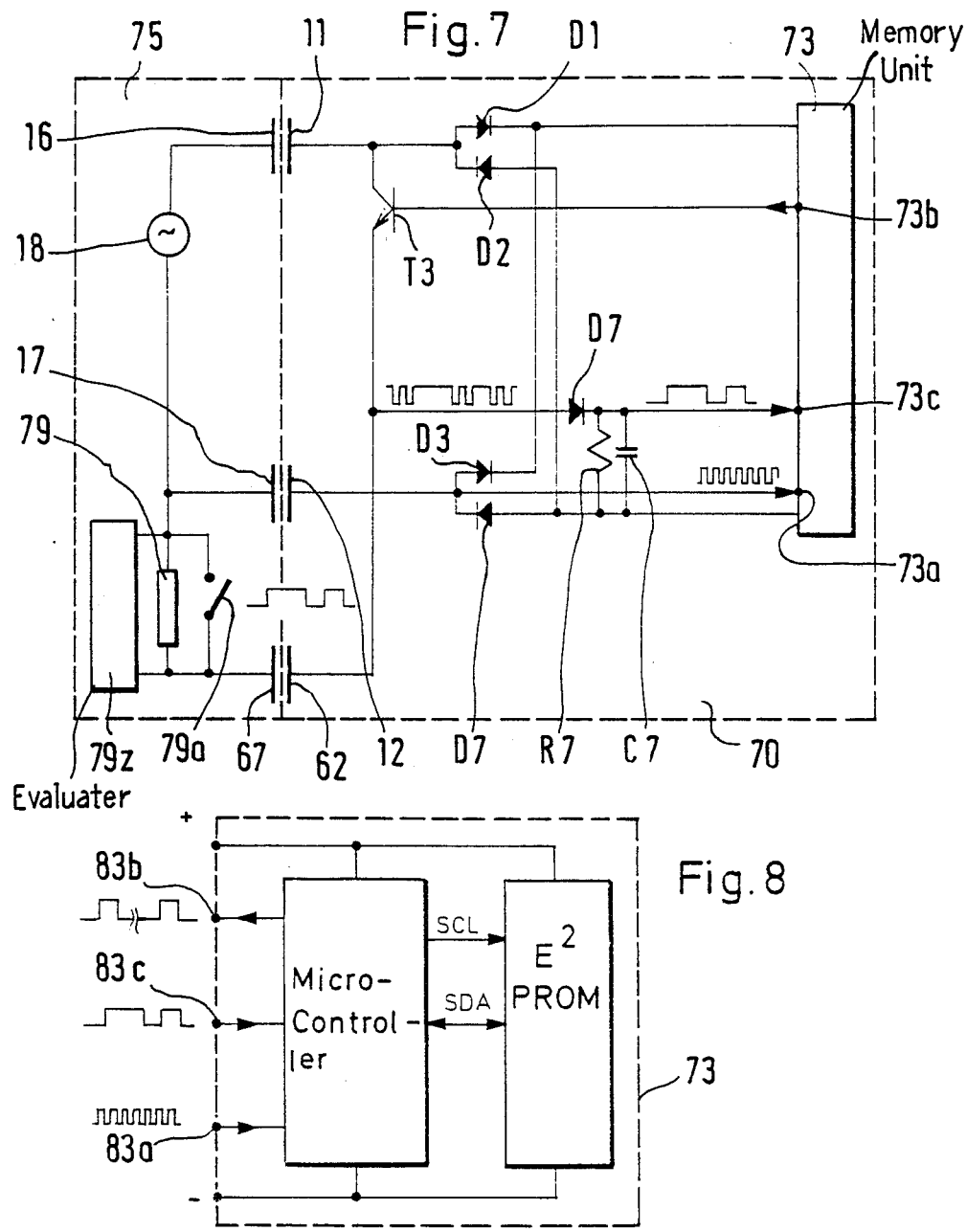

METHOD AND APPARATUS FOR NON-CONTACTING INFORMATION TRANSMISSION

BACKGROUND OF THE INVENTION

1. Field of the Invention

The invention is directed to a method and to an apparatus for non-contacting information transmission between a data carrier and a data reader, whereby a data generator and the data reader are locationally independent from one another and are brought together for information transmission.

The invention is further directed to an apparatus for non-contacting energy transmission, as well as to an apparatus for non-contacting modification of the electronic memory of the data carrier.

2. Description of the Related Art

German Pat. No. 31 49 789 discloses an apparatus which is referred to therein as inductive identification of an information and is especially suited for the interaction of an electronic key with a lock. Given this apparatus, an oscillator in the lock resonates and the high-frequency oscillation is picked up by the key when it approaches, the oscillation is modulated with a frequency or pulse pattern as key identifier and then the oscillation is retransmitted to the lock and further processed by an electronic recognition means in the lock. The output and return transmission of the high-frequency oscillation is accomplished by coils, i.e. inductively.

Such an inductive transmission is possible in a lock-key system because adequate space for a coil is provided in the key. One disadvantage, however, is that relatively large stray fields are emitted from the coils so that the transmission is therefore very high-loss. In many other data carriers, the accomodation of a coil is either not possible or requires too great a thickness of the data carrier when they are flat as, for example in credit cards.

SUMMARY OF THE INVENTION

It is therefore the object of the present invention to provide an apparatus for non-contacting information transmission that has low transmission losses and is also suitable for flat data carriers. Another object is to provide for energy transmission between the non-contacting elements and for the modification of the electronic memory of the data carrier.

These and other objects are inventively achieved by providing a capacitative coupling for at least two signal paths between a data carrier and a data reader for information transmission.

An apparatus for implementing the present method includes the data carrier having a surface fashioned with at least two planar electrodes. The data reader has at least two planar electrodes which are brought together with the electrodes of the data carrier so that capacitors are formed which produce at least one common circuit for the data carrier and the data reader for information transmission.

The invention is not limited to the transmission of information from a data carrier to a data reader. On the contrary, the data reader can also be fashioned as a data generator at the same time, and the data carrier, accordingly, can be fashioned for the acceptance or, respectively, modification of the information.

BRIEF DESCRIPTION OF THE DRAWINGS

FIG. 7 is a circuit diagram of an embodiment of the invention wherein the content of the data carrier can be modified;

FIG. 8 is a diagram of the structure of a memory unit for the invention;

DESCRIPTION OF THE PREFERRED EMBODIMENTS

Figure 1:
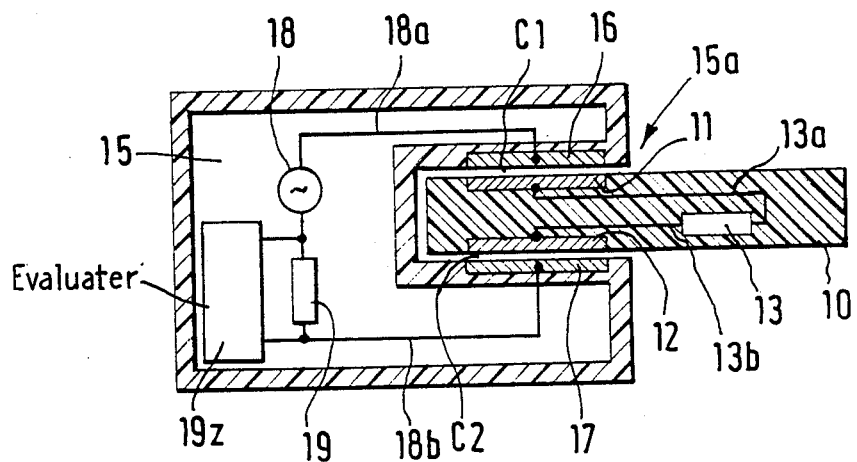
FIG. 1 is a cross section of a data carrier inserted into a slot in a data reader according to the principles of the present invention.

FIG. 1 shows the principle of the invention in an extremely simple embodiment. A data carrier 10 has a card shape as used, for example, in credit cards. FIG. 1 shows the data carrier 10 in section, whereby its cross section has been exaggerated in thickness to provide a clearer illustration of its parts. At its surface, the data carrier 10 has two planar electrodes 11 and 12 which are connected via lines or signal paths 13a and 13b to a coding resistor 13 disposed within the data carrier 10. For information transmission, the data carrier 10 is plugged into a slot 15a of data reader 15. Two electrodes 16 and 17 are arranged within the data reader 15 so that they are congruent with the electrodes 11 and 12 of the data carrier 10 when the latter is inserted into the slot 15a. The electrodes 11 and 16 and 12 and 17, respectively, form capacitors C1 and C2 that have an air gap between their electrodes. The electrodes 16 and 17 in the data reader 15 are connected to an a.c. generator 18 and to a precision resistor 19 via lines or signal pathes 18a and 18b.

Together with the coding resistor 13 and the precision resistor 19, the two capacitors C1 and C2 form what is referred to as a complex circuit wherein the volta $U_M$ drop across the precision resistor 19 for a sinusoidal generator voltage $U_G$ is established by the following equation:

$$U_M = R_M \left( (R_C + R_M)^2 + \frac{1}{\omega^2 c^2} \right)^{-\frac{1}{2}} \times U_G$$

Whereby
$R_M$=the value of the precision resistor 19
$R_C$=the value of the coding resistor 13

ω = the radian frequency of the generator 18
C = the equivalent capacitance of the capacitors C1 and C2

$$C = \left( \frac{1}{1/C1 + 1/C2} \right)$$

$U_G$ = the voltage of the generator 18

Of course, a square-wave generator can also be used as oscillator in the invention.

The voltage $U_G$ of the generator 18 and its frequency f or, respectively, its radian frequency $2\pi f = \omega$ can be prescribed. By providing an adequate mechanical guidance for the data carrier 10 in the slot 15a of the data reader 15, the capacitance C of the capacitors C1 and C2 fluctuates only within prescribable limits. Taking these limits into consideration, there is a clear relationship between the value of the coding resistor 13 and the voltage drop across the precision resistor 19. Depending on the precision of the mechanical guidance (and on the precision of the thickness of the data carrier 10), a greater or lesser plurality of values of the coding resistor 13 can be reliably discriminated on the basis of the voltage drop $U_M$ at the precision resistor 19 and can be processed in an evaluation means 19z.

As set forth in detail later with reference to FIG. 7, the data reader 15 can also be fashioned as a data generator at the same time. In this case, the data carrier 10 has an electronic memory replacing the resistor 13.

Figure 2:
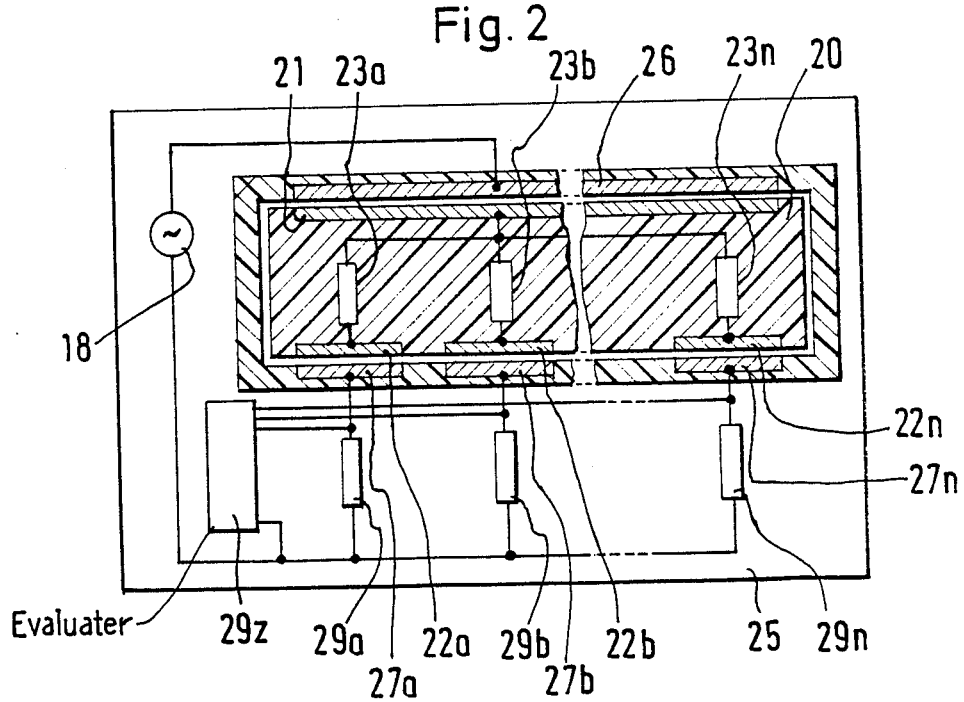
FIG. 2 is a cross section generally transversely of FIG. 1 of an expanded embodiment of the data carrier and data reader arrangement shown in FIG. 1 for a greater number of coding possibilities.

When the data carrier 10 contains only invariable information in the form of resistances, an increase in the number of coding possibilities can be achieved with the embodiment shown in FIG. 2. Herein, the data carrier 20 contains a plurality of coding resistors 23a, 23b through 23n, for example eight in number, of which each is connected to a common electrode 21 and to individual electrodes 22a, 22b through 22n. A data reader 25 contains a congruent common electrode 26 and congruent individual electrodes 27a, 27b through 27n. The individual electrodes 27a, 27b through 27n are connected to the generator 18 via individual precision resistors 29a, 29b through 29n in parallel at which n different signals are detected by an evaluation means 29z. The number of coding possibilities can be significantly increased in this way.

Figure 3:
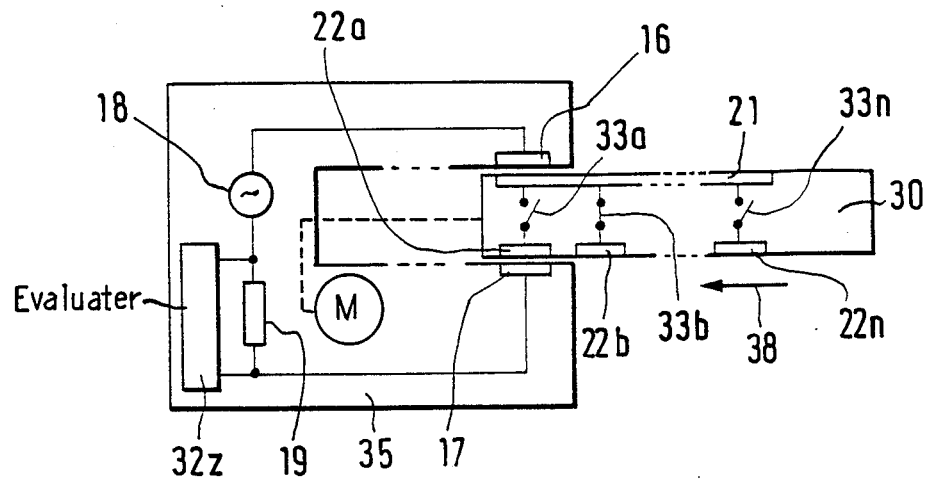
FIG. 3 is a schematic diagram of another arrangement of the invention for serial information transmission.

Another way of increasing the number of coding possibilities is shown in FIG. 3. Here, a data carrier 30 likewise contains a common electrode 21 and n individual electrodes 22a, 22b through 22n. The data reader 35, however, contains only two electrodes 16 and 17 and only one precision resistor 19. However, the data reader 35 also contains a motor M which moves the data carrier 30 in the direction of the arrow during the read operation, so that individual information elements are presented in chronological succession (serially) at the precision resistor 19 for an evaluation means 39z.

FIG. 3 additionally shows another embodiment of the coding elements or resistors composed only of switches 33a, 33b through 33n or of through or interrupted connections. In other words, the through connections, or closed switches have a resistance value substantially equal to zero, while the interrupted connections, or open switches, have an infinite resistance. Since only two different states are possible, the evaluation of the signals appearing at the precision resistor 19 is carried out in an especially simple way.

Figure 4:
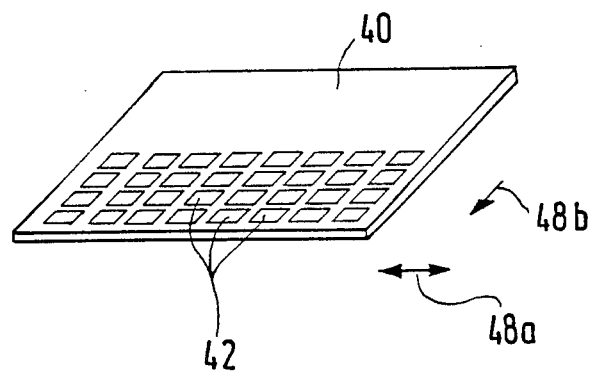
FIG. 4 is a perspective view of a data carrier of the invention with a matrix-like arrangement of electrodes.

The embodiments shown in FIGS. 2 and 3 can also be combined with one another. To that end, the data carrier 40 shown in FIG. 4 has a matrix array of, for example, 8×4 individual electrodes 42 on one side and information transmission ensures parallel to, for example, the direction 48a and ensues serially in the direction 48b in which the data carrier 40 is moved. When only coding elements having the values "connect" and "no connect" are used in an 8×4 matrix, then more than four billion coding possibilities are possible for the data carrier 40 yet it is very simple to manufacture in a layer format.

The method of the invention can be used not only for simply constructed data carriers—as shown in FIGS. 1 through 4—but can also be employed in data carriers having a considerably more complex structure. The coding resistor 13 in the fundamental illustration of FIG. 1 can also be chronologically varied, in value, for example by pulse modulation. All known types of modulation in communications technology can thereby be utilized such as pulse phase modulation, pulse pause modulation and pulse code modulation. To that end, the data carrier is provided not only a memory module for storing the coding but is also given further electronic components such as clocked networks, counters, decoder logic elements or microprocessors. Regardless of the various, possible realizations, two features are required, namely, the transmission of energy to the data carrier and the transmission of a clock signal to the data carrier.

Figure 5:
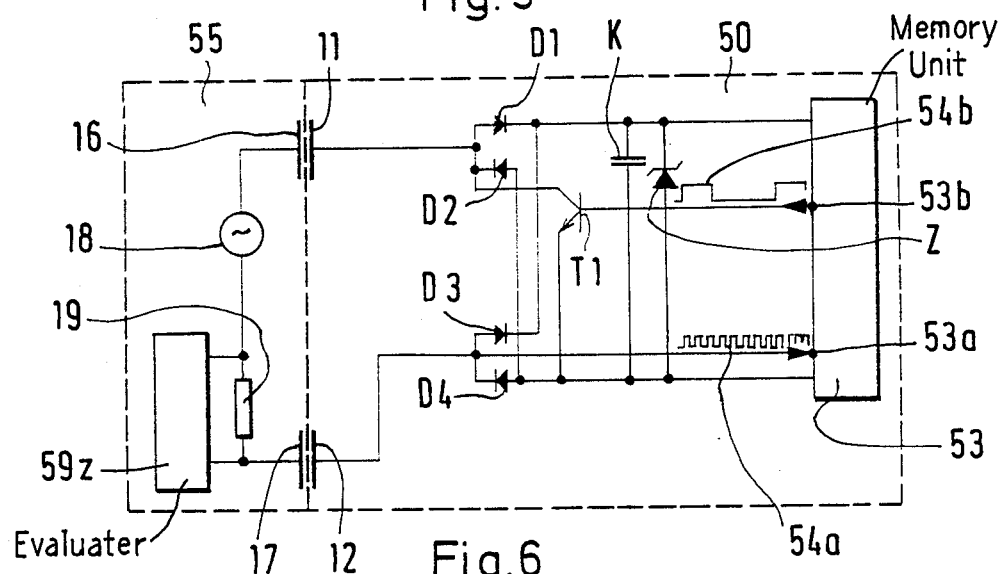
FIG. 5 is a circuit diagram of an embodiment of the invention including a clock signal for information editing and information transmission.

FIG. 5 shows a possible embodiment for the transmission of energy and of a clock signal into the data carrier 50 from the data reader 55 for information editing and information transmission. In this example, the electrodes 11 and 12 of the data carrier 50 are connected to one another via a rectifier arrangement that is composed of the diodes D1, D2, D3 and D4. A pulsating d.c. voltage is present at the outputs of the rectifier arrangement, this being smoothed by a capacitor K and limited by a Zener diode Z to generate a d.c. voltage. This d.c. voltage supplies the memory unit 53.

A clock signal 54a, whose frequency is established by the generator 18, is received at the electrode 12 and drawn from the negative output of the rectifier arrangement and is supplied to the clock input 53a of the memory unit 53. Controlled by the clock signal 54a, the memory unit 53 serially outputs the content of its electronic memory at a data output 53b. This output signal 54b is supplied to a transistor T1 which modulates the internal resistance of the data carrier 50 by short-circuiting the positive half-waves during high levels of the output signal 54b. Dependent on the step-down factor of the clock signal 54a, the memory unit 53 thereby always shorts more and more positive half-waves in succession.

The short-circuit of the half-waves is identified at the precision resistor 19 of the data reader 55 and is processed in an evaluation unit 59z. The memory unit 53 can be executed in many embodiments in known technology; one possibility is described in greater detail in FIG. 8.

Figure 6:
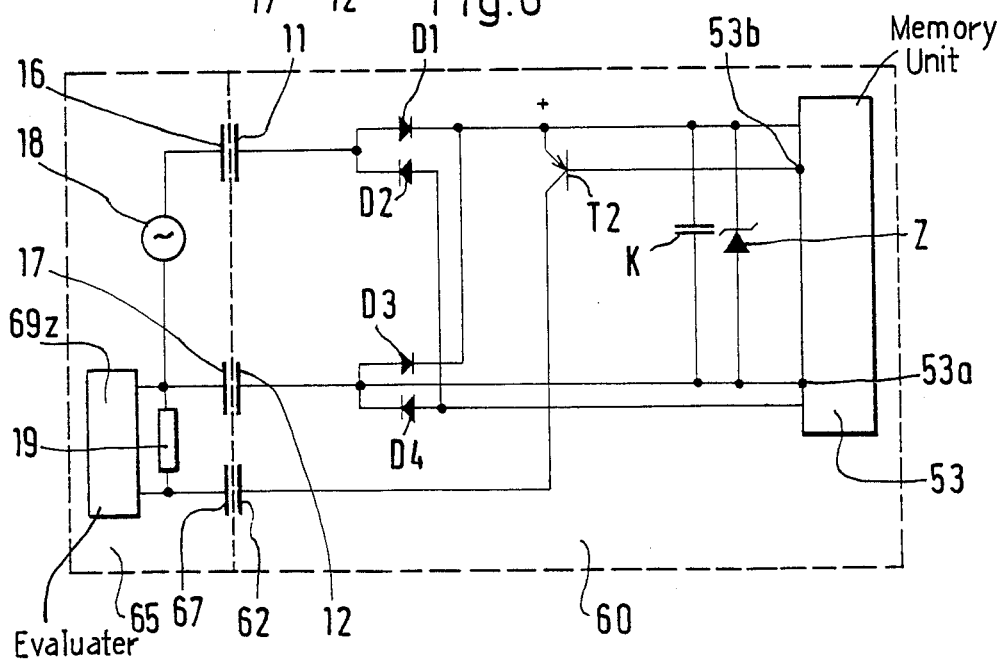
FIG. 6 is a circuit diagram of an embodiment of the invention having a separate path for the information transmission.

FIG. 6 shows a further embodiment of the invention wherein a separate channel is provided for the transmission of the information. For this purpose, a data carrier 60 has a third planar electrode 62 and the data reader 65, accordingly, has a third congruent electrode 67. Since the precision resistor 19 in this case is only traversed by the signal transmitted to the data reader 65, the evaluation of the voltage drop thereacross by an evaluation unit 69z is considerably simpler than in the example shown in FIG. 5. Further, nearly all of the energy that is transmitted into the data carrier 60 is available for the operations in the data carrier 60 since the transmission of information into the data reader 65 requires only a little energy in this exemplary embodiment. In contrast to FIG. 5, only the internal resistance of the information channel is now modulated. A pnp transistor T2 used therefor has its emitter lying at the positive output of the rectifier arrangement and can thus be driven via a defined base-emitter voltage.

Otherwise, the circuit of FIG. 6 corresponds to the circuit in FIG. 5, as is evident from the identical reference characters.

FIG. 7 shows an especially advantageous embodiment of the invention wherein the content of a data carrier 70 is modified. To this end, a resistor 79 is used not only for providing a voltage drop for the read operation—as in the preceding exemplary embodiments—but the resistor 79 itself is modulated, for example with a switch 79a. This modulation is received in the data carrier 70 at the emitter of a transistor T3. The data transmission to the data carrier 70 and to a data reader/-generator 75 is thereby expediently undertaken chronologically separated.

As in the preceding exemplary embodiments, the generator 18 also generates a clock signal. This clock signal is coupled to a clock input 73a of a memory unit 73 via the electrode 12. The clock signal is modulated by the switch 79a so that a plurality of clock pulses having high and low voltage are supplied to the data carrier 70 via the electrode 62. The high-frequency, modulated clock signal is demodulated by a diode D7 and by a low-pass filter composed of a resistor R7 and of a capacitor C7. The clock signal is subsequently supplied to a write input 73a of the memory unit 73. In this case, too, the memory unit 73 is executed in known technology and, for example, can be realized with most one-chip microprocessors, whereby an electrically programmable and erasable memory is used as a data memory.

FIG. 8 shows an exemplary embodiment of the memory unit 73. The memory unit 73 includes a microprocessor or microcontroller Valvo PCB 84C00 and an electrically programmable memory (E$^2$PROM) Valvo PCB 8582. The voltage supply for the two component parts is referenced (+) and (−). The clock signal for the microcontroller is supplied to an input 83a. Only one arbitrary line of eight available lines of an input port 83C is used as a write input. Likewise, only one arbitrary line of the eight lines of the output port 83b is used. A connection SCL for the serial clock signal of the microcontroller and a bidirectional connection SDA for the serial data transmission to and from the E$^2$PROM is present between the microcontroller and the E$^2$PROM.

When the memory unit 73 is used as the memory unit 53 for FIGS. 5 and 6, of course, the write input 83C is omitted.

Figure 9:
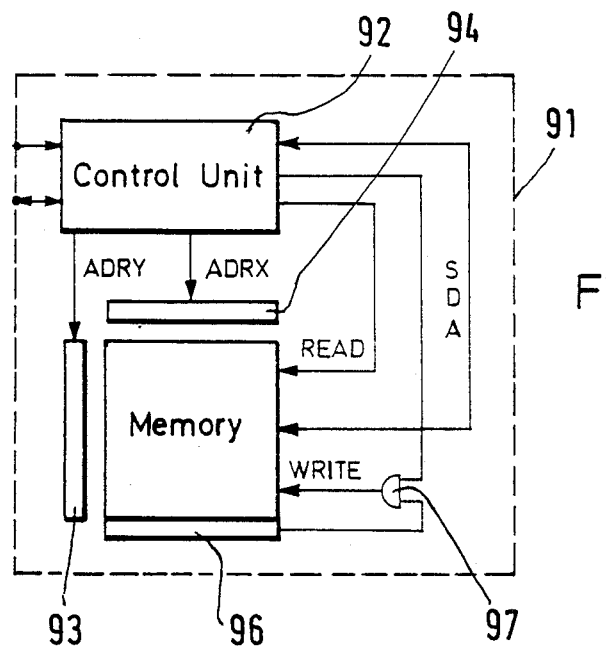
FIG. 9 is a diagram of a circuit including a program protection for a memory unit.

In an advantageous embodiment, the E$^2$PROM is replaced by a customized component part 91 that is shown in FIG. 9. With this embodiment, further programming can be prevented by a specific write information or, respectively, by a last program step. Like every electrically programmable memory, the customized component part 91 has a control unit 92 which is connected to the memory matrix 95 via the following lines: a bidirectional, serial data line SDA; address lines ADRY and ADRX to a row register 93 and a column register 94; a line READ for the read output signal; and a line WRITE for the write signal. For write protection, this last line WRITE is connected, for example, to the last row 96 of the memory matrix 95 via and AND gate 97. As soon as this last row 96 is written with appropriate information, the input of the AND gate 97 that belongs to it always lies at "0", so that a write operation is no longer possible for the overall memory matrix 95.

Such a programming protection can also be designed for specific areas of the memory matrix, so that protected and unprotected areas are simultaneously possible.

As already mentioned, the illustrated exemplary embodiments of the data carrier are suitable for credit cards, but are also suitable for any other kind of flat data carrier such as, for example, identification cards, cards for access or use monitoring, cards for opening doors, ATM cards, etc. The exemplary embodiment described with FIG. 7 is especially suitable for data carriers wherein a variable value, for example a statement of account, must be up-dated.

Figure 10:
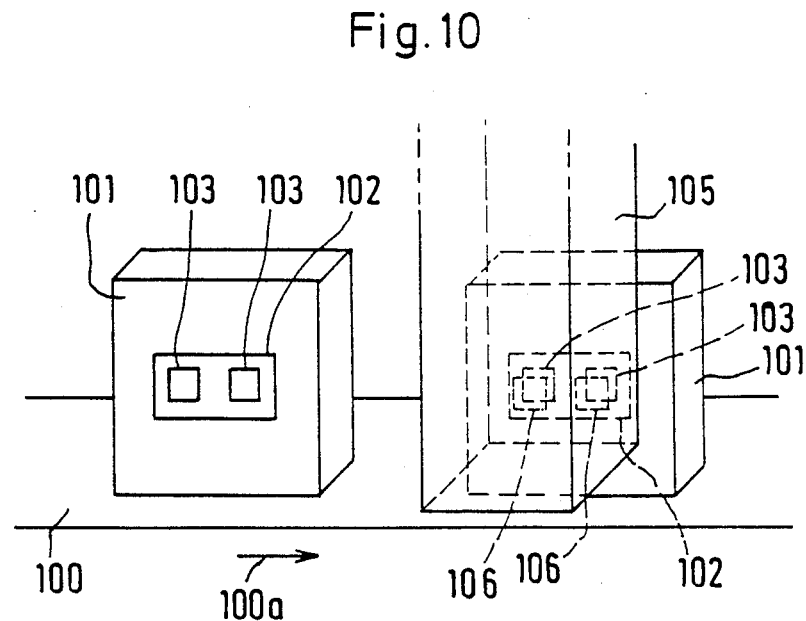
FIG. 10 is a perspective schematic of an applied example of the invention for the identification of parts at their surface.

FIG. 10 shows a further example of the use of the present invention. Herein, workpieces 101 moving in a direction 100a on a conveyor belt 100 are identified and/or provided with additional data. To this end, a data carrier 102 is glued or otherwise fastened to every workpiece 101. Two or more electrodes 103 are provided arranged on the same side of each data carrier 102. A data reader or date reader and generator 105 is brought adjacent to the workpiece 101, for example by contact sensors (not shown), so that electrodes 106 reside opposite the electrodes 103 of the data carrier 102 on the workpiece 101 at a slight distance therefrom. The read or, respectively, the read and write operation can thereafter ensue.

Although other modifications and changes may be suggested by those skilled in the art, it is the intention of the inventor to embody within the patent warranted hereon all changes and modifications as reasonably and properly come within the scope of his contribution to the art.

I claim:

1. An apparatus for non-contacting information transmission between a data carrier and a data reader which are locationally independent of one another and are brought together for information transmission, comprising:
    at least two planar electrodes provided at a surface of the data carrier;
    at least two planar electrodes in the data reader which are brought together with said at least two planar electrodes of the data carrier to form capacitors for information transmission by producing at least one common circuit for the data carrier and the data reader;
    at least one coding resistor having a predetermined resistance value connected between said at least two electrodes of the data carrier, said predetermined resistance value of said at least one coding resistor corresponding to the information for transmission;
    an oscillator in the data reader having outputs connected to said at least two electrodes of the data reader;

a precision resistor connected between said oscillator and at least one of said at least two electrodes of the data reader; and an evaluation means connected to said precision resistor for evaluating the information corresponding to said predetermined resistance value by a voltage drop across said precision resistor.

2. An apparatus as claimed in claim 1, wherein said at least two electrodes in said data carrier is a matrix array of electrodes.

3. An apparatus as claimed in claim 1, wherein said at least two electrodes of the data carrier are at least three electrodes, and further comprising:

means for placing ones of said at least three electrodes of the data carrier sequentially opposite one of said at least two electrodes of data readers.

4. An apparatus for non-contacting information transmission between a data carrier and a data reader which are locationally independent of one another and a brought together for information transmission, comprising:

at least two planar electrodes provided at a surface of the data carrier;

at least two planar electrodes in the data reader which are brought together with said at least two planar electrodes of the data reader to form capacitors for information transmission by producing at least one common circuit for the data carrier and the data reader;

an oscillator in the data reader having outputs connected to said at least two electrodes of the data reader;

a precision resistor connected between said oscillator and at least one of said at least two electrodes of the data reader;

an evaluation means connected to said precision resistor for evaluating the information for transmission by a voltage drop across said precision resistor;

a rectifier arrangement having inputs connected to said at least two planar electrodes in the data carrier;

a transistor in the data carrier having at least one lead connected to said rectifier arrangement;

an electronic memory unit connected to said rectifier arrangement and said transistor;

a clock signal of said oscillator controlling information output from said memory unit in the data carrier.

5. An apparatus for noncontacting information transmission between a data carrier and a data reader which are locationally independent of one another and are brought together for information transmission, comprising:

three planar electrodes provided at a surface of the data carrier;

three planar electrodes in the data reader which are brought together with said three planar electrodes of the data carrier to form capacitors for information transmission by producing at least one common circuit for the data carrier and the data reader;

an oscillator in the data reader having outputs connected to said three electrodes of the data reader;

a precision resistor connected between said oscillator and at least one of said three electrodes of the data reader;

an evaluation means connected to said precision resistor for evaluating the information by a voltage drop across said precision resistor;

a rectifier arrangement having inputs connected to two of said three planar electrodes in the data carrier;

a transistor in the data carrier having at least one lead connected to said rectifier arrangement;

an electronic memory unit connected to said rectifier arrangement and said transistor;

one of said three electrodes in the data carrier directly connected to a data output of said electronic memory unit by said transistor;

said oscillator in the data reader having first and second leads directly connected respective first and second ones of said three electrodes in the data reader, a clock signal of said oscillator controlling information output from said memory unit; and said precision resistor in the data reader connecting one of said first and second leads of said oscillator to a third one of said three electrodes.

6. An apparatus as claimed in claim 5, wherein said electronic memory unit is an electronic read-write memory unit connected to first and second ones of said three electrodes of the data carrier by said rectifier arrangement and said transistor;

a demodulator in the data carrier connected to a third of said three electrodes, said demodulator being connected to a write input of said read-write memory unit;

said transistor being connected to a data output of said read-write memory unit;

means for modulating the voltage drop across said precision resistor for information transmission to said read-write memory unit; and said evaluation means connected to said resistor for evaluation signals transmitted from said read-write memory unit, the transmitted signals being evident by a voltage drop across said resistor.

7. An apparatus as claimed in claim 6, wherein transmission of information to said read-write memory unit is chronologically discrete from transmission of information from said read-write memory unit.

* * * * *